US012607651B2

(12) United States Patent
Chen et al.

(10) Patent No.: US 12,607,651 B2
(45) Date of Patent: Apr. 21, 2026

(54) PROBE CARD MONITORING SYSTEM AND MONITORING METHOD THEREOF

(71) Applicant: HERMES TESTING SOLUTIONS INC., Hsinchu City (TW)

(72) Inventors: Wei-Ting Chen, Hsinchu City (TW); Shih-Ying Chou, Hsinchu City (TW)

(73) Assignee: HERMES TESTING SOLUTIONS INC., Hsinchu City (TW)

( * ) Notice: Subject to any disclaimer, the term of this patent is extended or adjusted under 35 U.S.C. 154(b) by 273 days.

(21) Appl. No.: 18/314,146

(22) Filed: May 9, 2023

(65) Prior Publication Data

US 2024/0345134 A1    Oct. 17, 2024

(30) Foreign Application Priority Data

Apr. 13, 2023    (TW) .................................. 112113754

(51) Int. Cl.
| | |
|---|---|
| *G01R 1/073* | (2006.01) |
| *G01R 1/02* | (2006.01) |
| *G01R 1/04* | (2006.01) |
| *G01R 1/067* | (2006.01) |
| *G01R 31/02* | (2006.01) |
| *G01R 31/26* | (2020.01) |
| *G01R 31/28* | (2006.01) |

(52) U.S. Cl.
CPC ..... *G01R 1/07342* (2013.01); *G01R 1/07314* (2013.01); *G01R 31/2889* (2013.01)

(58) Field of Classification Search
CPC . G01R 1/02; G01R 1/04; G01R 1/067; G01R 1/073; G01R 1/44; G01R 31/02; G01R 31/26; G01R 31/28
See application file for complete search history.

(56) References Cited

U.S. PATENT DOCUMENTS

| | | | |
|---|---|---|---|
| 2003/0085724 A1* | 5/2003 | Mathieu ............. | G01R 31/2886 |
| | | | 324/750.03 |
| 2004/0217769 A1* | 11/2004 | DiOrio ................. | G01R 1/0483 |
| | | | 324/750.22 |

* cited by examiner

*Primary Examiner* — Neel D Shah
(74) *Attorney, Agent, or Firm* — JCIPRNET

(57) ABSTRACT

A probe card monitoring system is adapted for any one of a probe card including a reinforcement frame and a printed circuit board or a prober including a head plate and a clamping mechanism, and includes at least one sensor and a control unit. The at least one sensor is disposed in one of the probe card and the prober to measure a distance between the probe card and the prober in at least one axial direction. The control unit is coupled to the at least one sensor and is configured to issue an alarm. A probe card monitoring method is also provided.

18 Claims, 8 Drawing Sheets

PROBE CARD MONITORING SYSTEM AND MONITORING METHOD THEREOF

CROSS-REFERENCE TO RELATED APPLICATION

This application claims the priority benefit of Taiwanese application no. 112113754, filed on Apr. 13, 2023. The entirety of the above-mentioned patent application is hereby incorporated by reference herein and made a part of this specification.

BACKGROUND

Technical Field

The disclosure relates to a probe card monitoring system and a monitoring method thereof.

Description of Related Art

In the field of semiconductor testing, with continuous technological innovation and development, the volume of a chip is increasingly reduced, and a spacing between each pad is increasingly dense. In such circumstances, the probability of offset of a probe card due to adversely affected clamping or excessive downforce during a wafer testing process gradually increases. Positional offsets of a prober and a wafer testing point may cause damage (e.g., burnt probes) to the probe card, the wafer, and an integrated circuit (IC).

However, at present, it is only possible to check whether the probe card is offset through a probe lens or to determine whether there is offset from probe marks at the wafer testing point after testing. These approaches may lengthen the testing time and cannot reflect the status of the probe card during the testing process in real time.

SUMMARY

The disclosure provides a probe card monitoring system and a monitoring method thereof, in which the status of the probe card during the testing process may be reflected in real time, reducing the probability of damage to the probe card and the wafer and improving the accuracy of measurement.

In an embodiment of the disclosure, a probe card monitoring system is adapted for any one of a probe card or a prober. The probe card includes a reinforcement frame and a printed circuit board. The prober includes a head plate and a clamping mechanism. The probe card monitoring system includes at least one sensor and a control unit. The at least one sensor is disposed in one of the probe card and the prober to measure a distance between the probe card and the prober in at least one axial direction. The control unit is coupled to the at least one sensor and configured to issue an alarm.

In an embodiment of the disclosure, a probe card monitoring method is adapted for any one of a probe card a prober. The probe card includes a reinforcement frame and a printed circuit board. The prober includes a head plate and a clamping mechanism. The probe card monitoring method includes at least the following. At least one sensor is disposed in one of the probe card and the prober. Whether a distance between the probe card and the prober in at least one axial direction obtained by the at least one sensor exceeds an abnormality condition is determined. An alarm is issued by a control unit in response to the abnormality condition being exceeded.

Based on the foregoing, in the embodiments of the disclosure, the sensor configured to measure the relative distance between the probe card and the prober in at least one axial direction and the control unit that issues an alarm are introduced into the probe card monitoring system. In this way, the status of the probe card during the testing process may be reflected in real time by monitoring the value of the distance, reducing the probability of damage to the probe card and the wafer and improving the accuracy of measurement.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
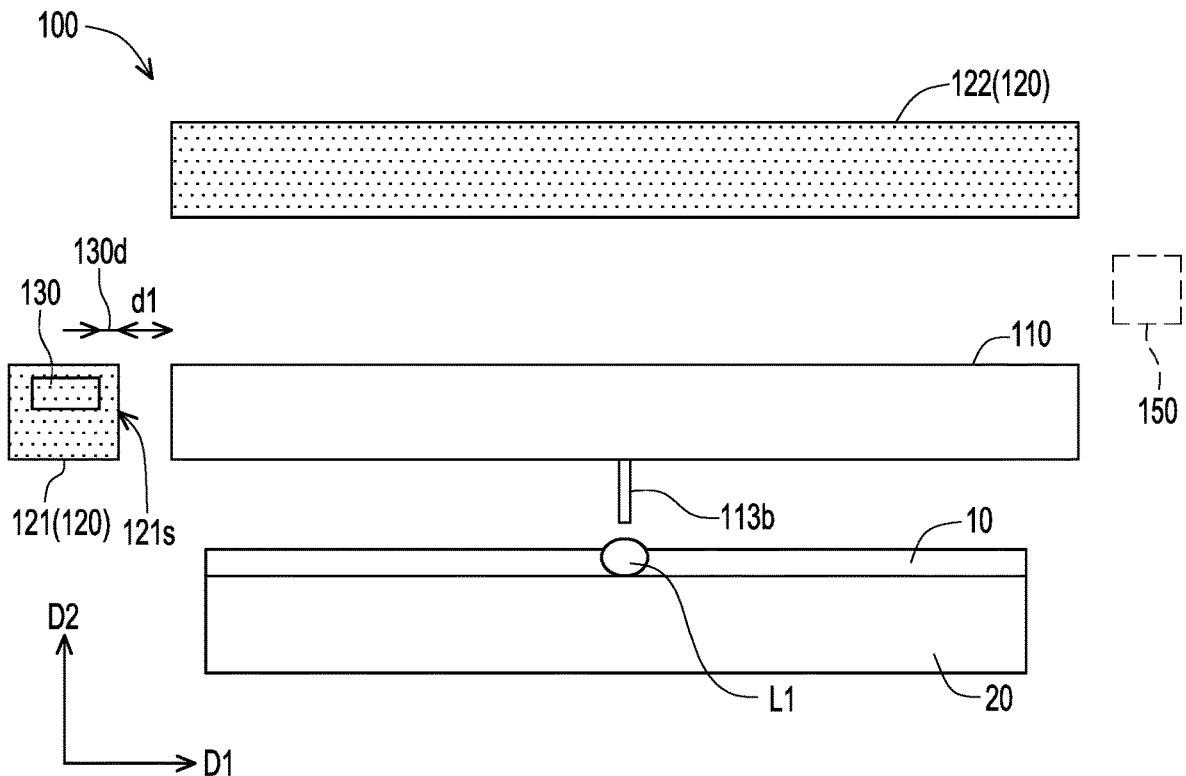
FIG. 1 is a schematic partial side view of a probe card monitoring system according to some embodiments of the disclosure.

In the following detailed description, for purposes of explanation and not limitation, example embodiments disclosing specific details are set forth to provide a thorough understanding of various principles of the disclosure. Nonetheless, it will be apparent to one having ordinary skills in the art, having had the benefit of the disclosure, that the disclosure may be practiced in other embodiments that depart from the specific details disclosed herein. Moreover, descriptions of well-known devices, methods, and materials may be omitted so as not to obscure the description of various principles of the disclosure.

Exemplary embodiments of the disclosure will be fully described below with reference to the drawings, but the disclosure may also be embodied in many different forms and should not be construed as limited to the embodiments described herein. In the drawings, for the sake of clarity, the sizes and thicknesses of various regions, parts, and layers may not be drawn to the actual scale, and some components may be omitted.

Unless otherwise defined, all terms (including technical and scientific terms) used herein have the same meanings as commonly understood by one of ordinary skills in the art to which the disclosure pertains.

In the embodiments of the disclosure, the sensor configured to measure the relative distance between the probe card and the prober in at least one axial direction and the control unit that issues an alarm are introduced into the probe card monitoring system. In this way, the status of the probe card during the testing process may be reflected in real time by monitoring the value of the distance, reducing the probability of damage to the probe card and the wafer and improving the accuracy of measurement. The sensor may be disposed in one of the probe card and the prober, and the at least one axial direction may be one, two, or three of the X axis, the Y axis, and the Z axis. The implementations of various probe card monitoring systems and probe card monitoring methods corresponding to the monitoring systems will be described below. Here, the probe card and the prober may be of any suitable type, which is not limited by the disclosure.

Figure 2:
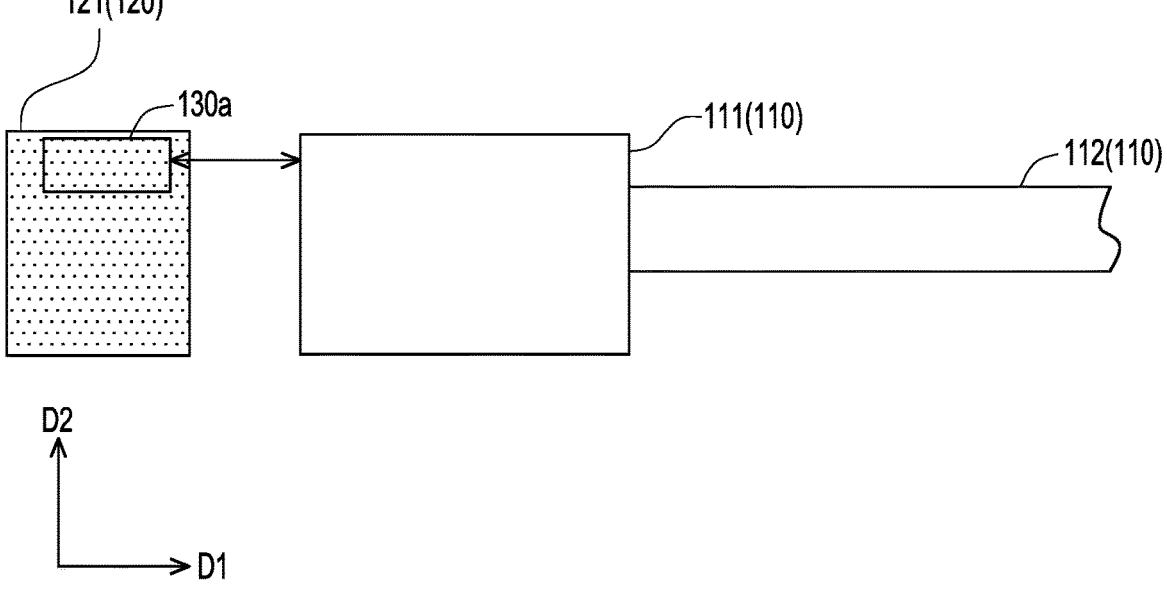
FIG. 2 is a schematic partially enlarged view based on FIG. 1.
Figure 3:
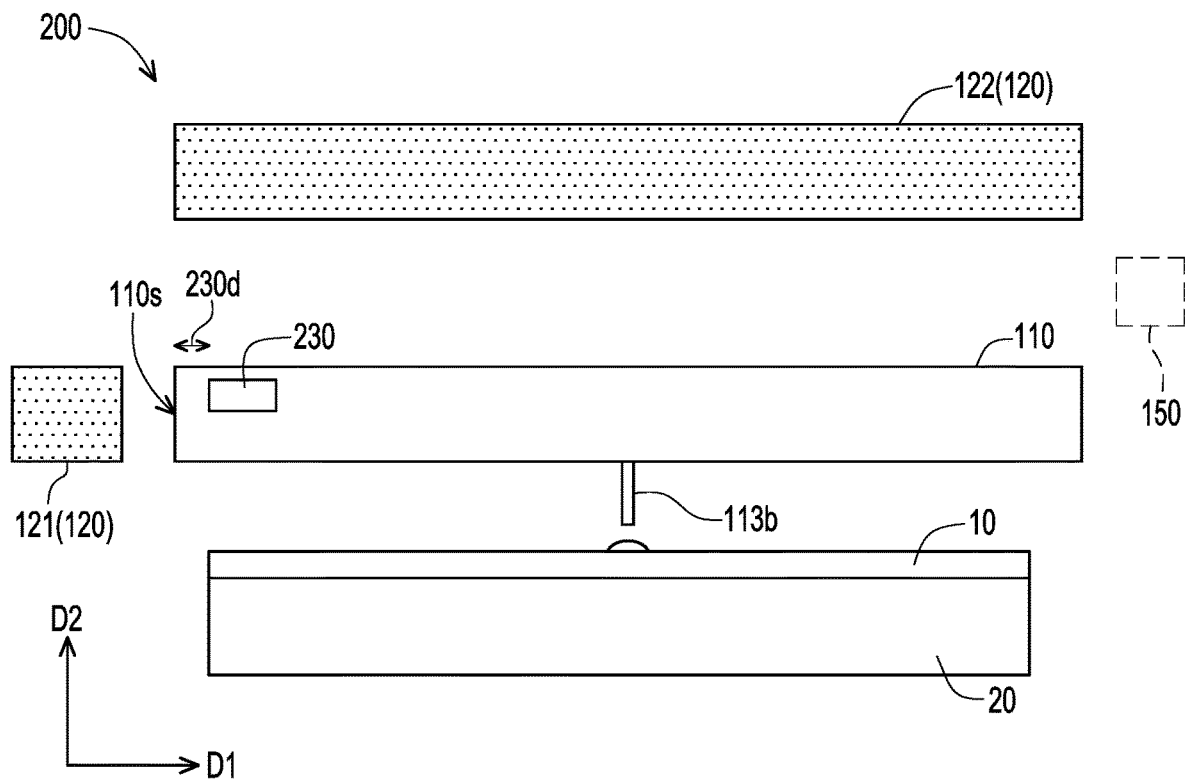
FIG. 3 is a schematic partial side view of a probe card monitoring system according to some embodiments of the disclosure.
Figure 4:
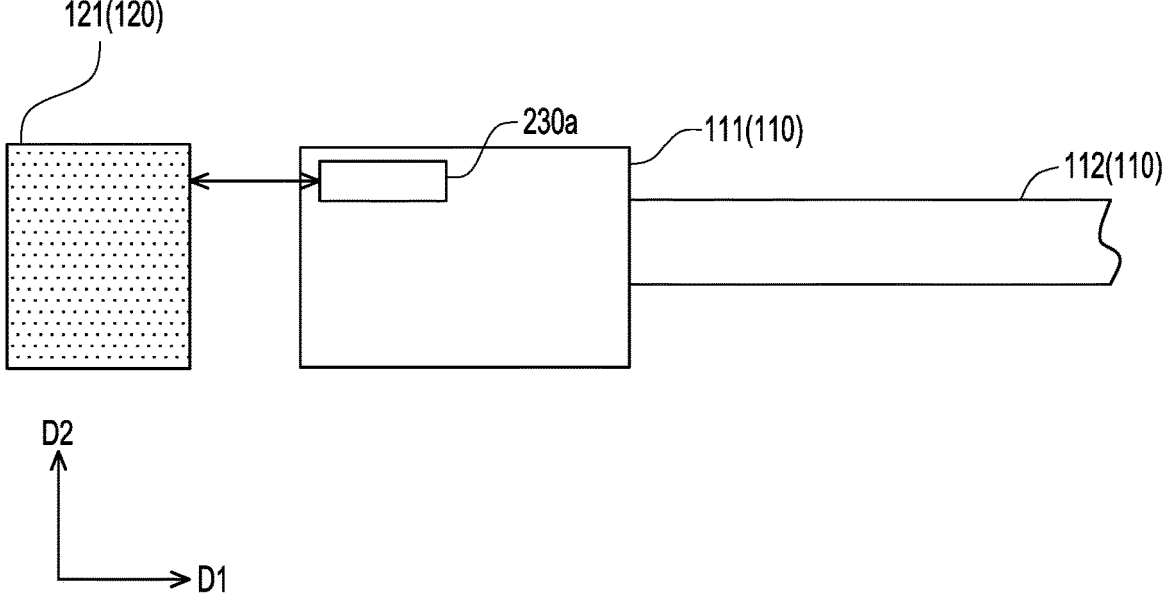
FIG. 4 is a schematic partially enlarged view based on FIG. 3.
Figure 5:
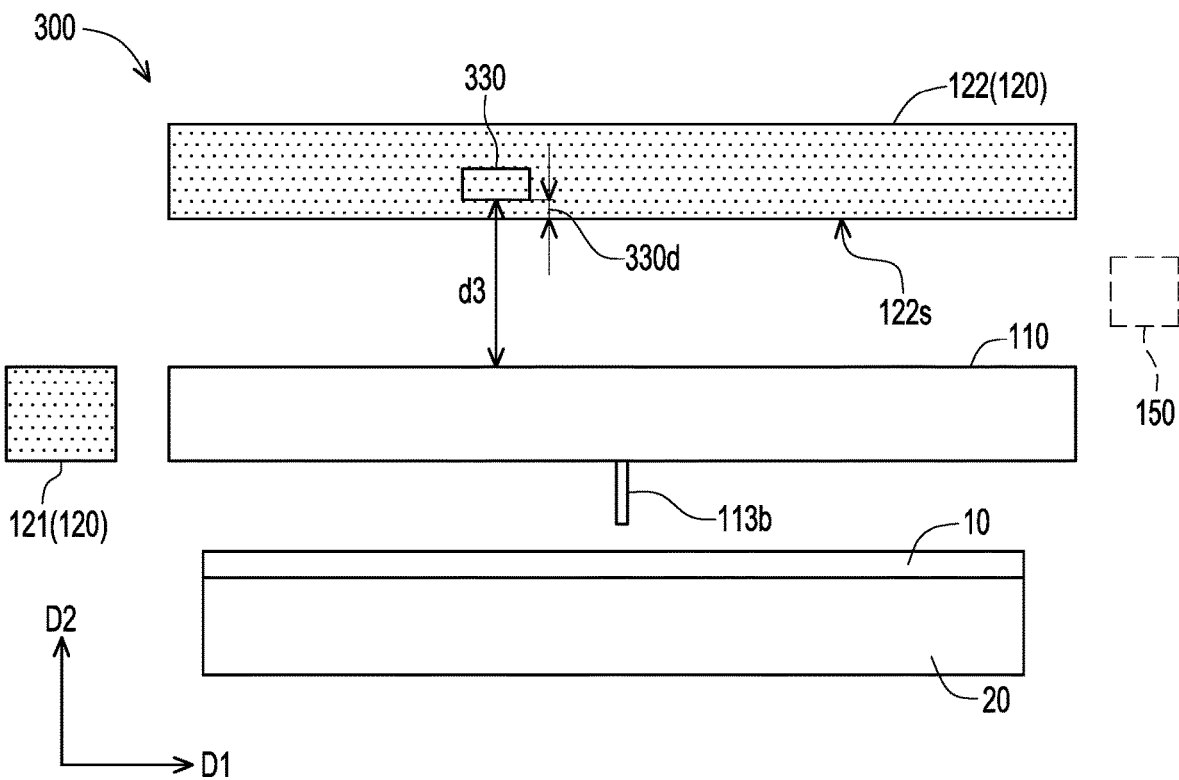
FIG. 5 is a schematic partial side view of a probe card monitoring system according to some embodiments of the disclosure.
Figure 6A:
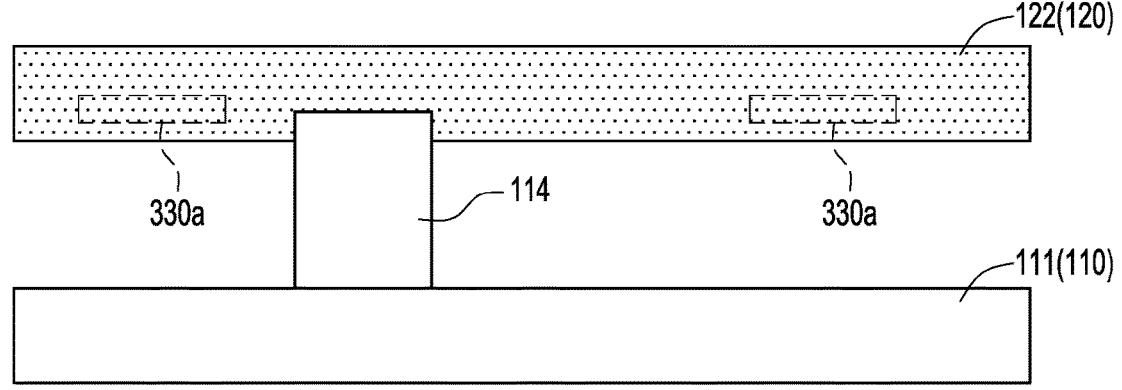
FIG. 6A and FIG. 6B are schematic partially enlarged views in different perspectives based on FIG. 5.
Figure 6B:
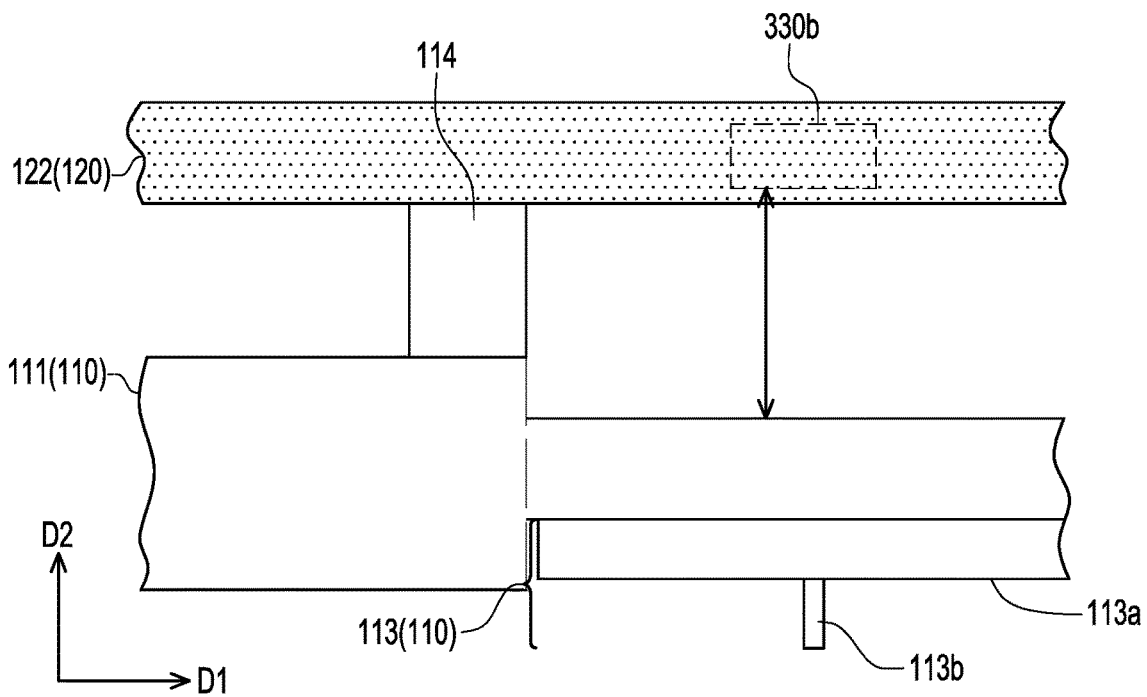
Figure 7:
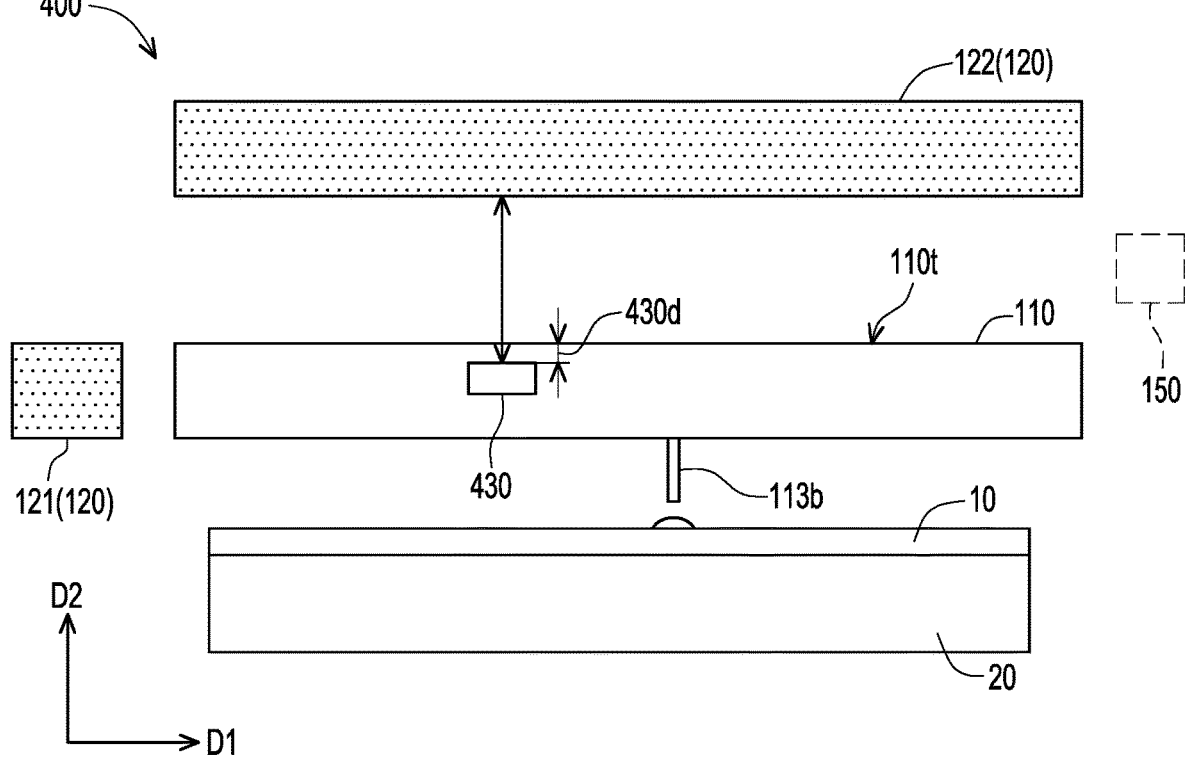
FIG. 7 is a schematic partial side view of a probe card monitoring system according to some embodiments of the disclosure.
Figure 8A:
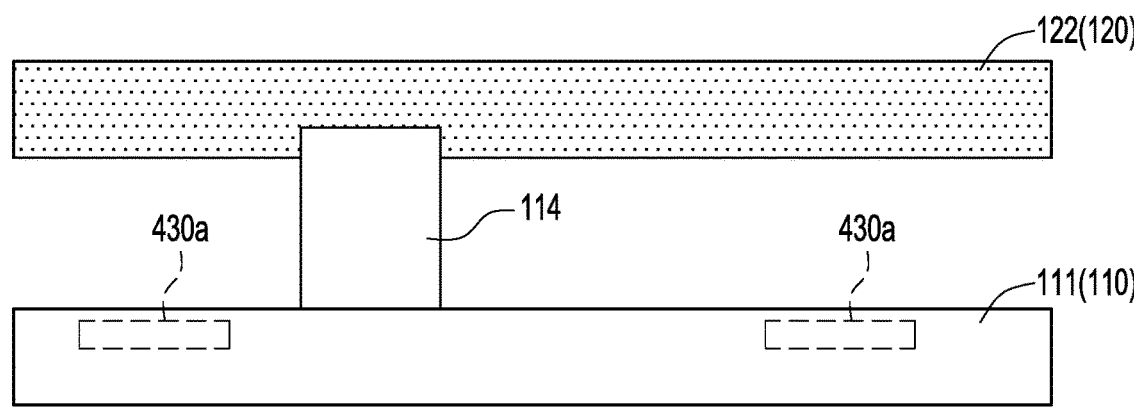
FIG. 8A and FIG. 8B are schematic partially enlarged views in different perspectives based on FIG. 7.
Figure 8B:
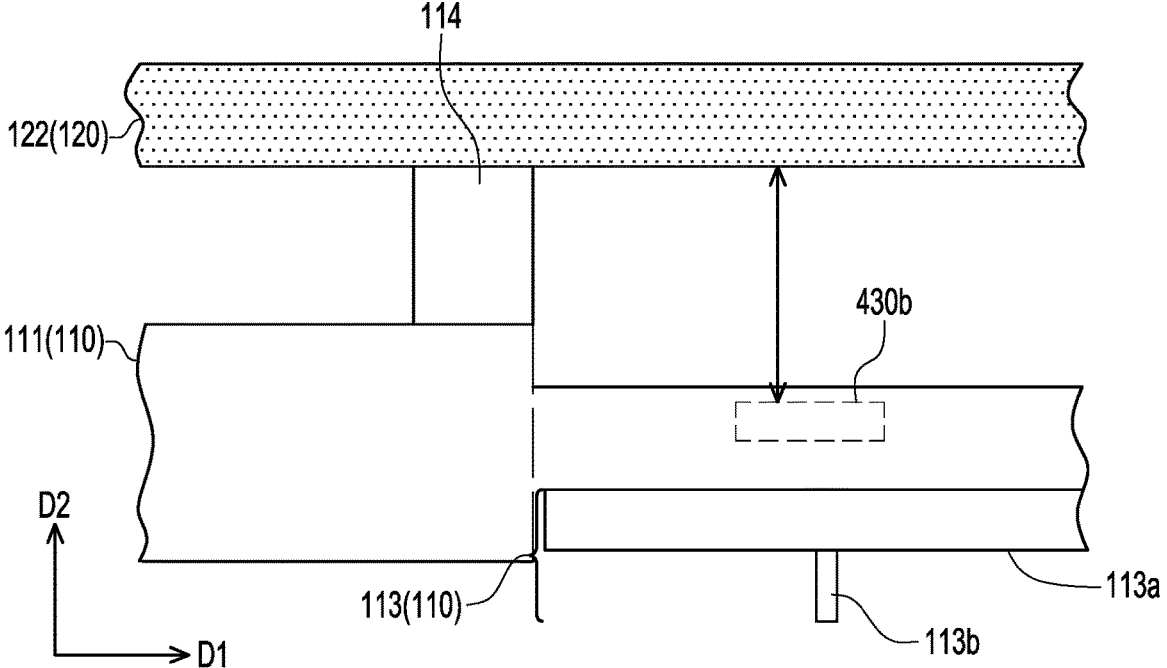
Figure 9:
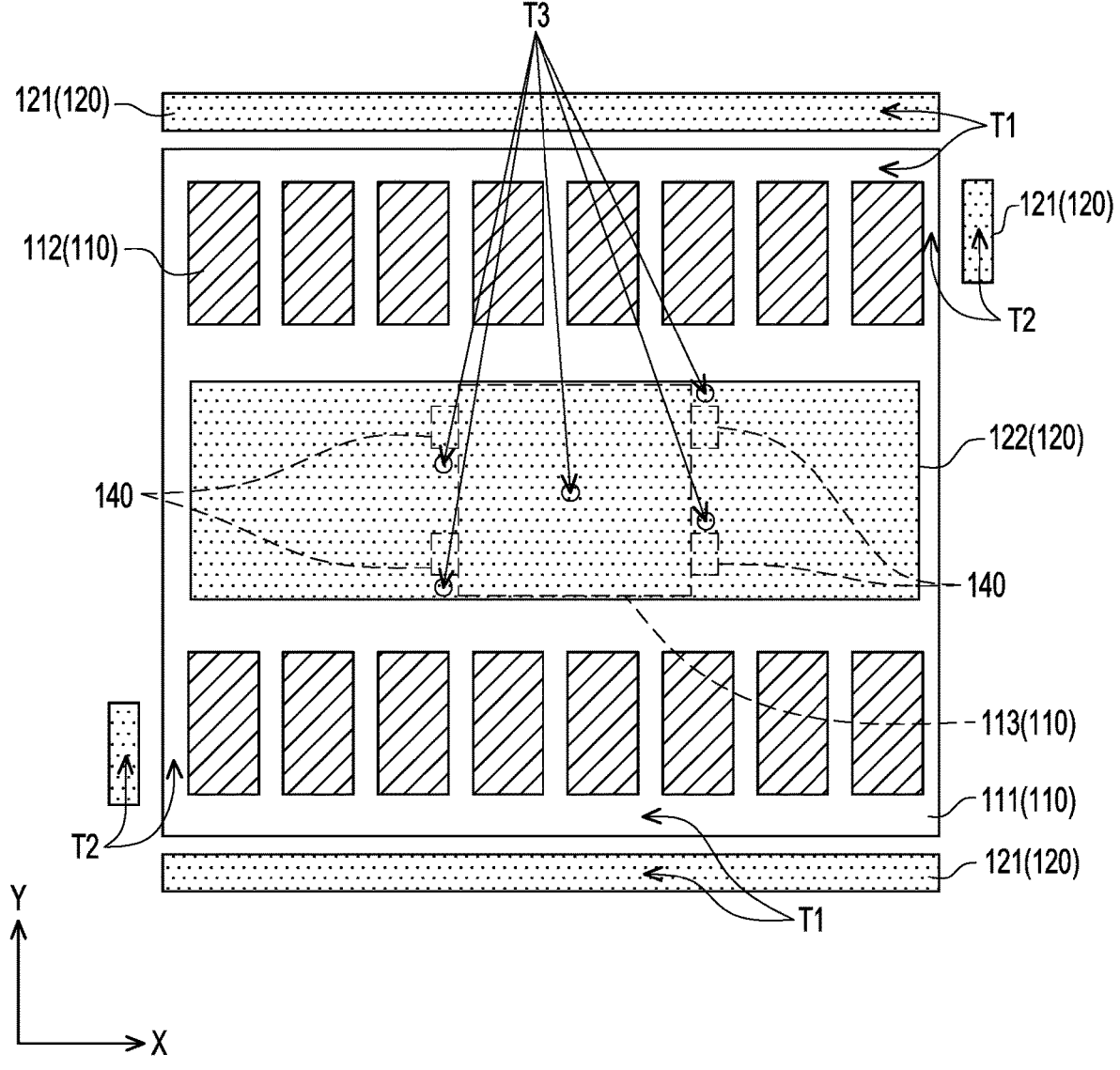
FIG. 9 is a schematic partial top view of a probe card monitoring system according to some embodiments of the disclosure.

FIG. 1 is a schematic partial side view of a probe card monitoring system according to some embodiments of the disclosure. FIG. 2 is a schematic partially enlarged view based on FIG. 1. FIG. 3 is a schematic partial side view of a probe card monitoring system according to some embodiments of the disclosure. FIG. 4 is a schematic partially enlarged view based on FIG. 3. FIG. 5 is a schematic partial side view of a probe card monitoring system according to some embodiments of the disclosure. FIG. 6A and FIG. 6B are schematic partially enlarged views in different perspectives based on FIG. 5. FIG. 7 is a schematic partial side view of a probe card monitoring system according to some embodiments of the disclosure. FIG. 8A and FIG. 8B are schematic partially enlarged views in different perspectives based on FIG. 7. FIG. 9 is a schematic partial top view of a probe card monitoring system according to some embodiments of the disclosure.

It should be noted that the following implementations are only exemplarily illustrate, and are not intended to limit the disclosure to these implementations. FIG. 1, FIG. 2, FIG. 3, FIG. 4 may be used to illustrate the implementation of monitoring any one of the X axis and Y axis, FIG. 5, FIG. 6A, FIG. 6B, FIG. 7, FIG. 8A, FIG. 8B may be used to illustrate the implementation of monitoring the Z axis, FIG. 9 may be used to illustrate the design of monitoring measure points corresponding to the X axis, Y axis, and Z axis, and FIG. 10A, FIG. 10B, and FIG. 11 may be used to illustrate a probe card monitoring method. In addition, at least the contact tab (e.g., the contact tab 114 shown in FIG. 6A, FIG. 6B, FIG. 8A, and FIG. 8B) connecting the probe card and the prober is omitted for clarity of illustration in FIG. 1, FIG. 3, FIG. 5, and FIG. 7.

With reference to FIG. 1, a probe card monitoring system 100 is adapted for any one of a probe card 110 and a prober 120 connected to the probe card 110. The prober 120 may include a head plate 121 configured to measure the distance between the probe card 110 and the prober 120 on the X axis or the Y axis (a first axial direction D1) and a clamping mechanism 122 configured to measure the distance between the probe card 110 and the prober 120 on the Z axis (a second axial direction D2). Here, the clamping mechanism 122 may be a bridge beam, but the disclosure is not limited thereto, and the clamping mechanism 122 may also use other suitable ways of clamping.

In addition, in this embodiment, the probe card monitoring system 100 includes a sensor 130 disposed in the head plate 121 of the prober 120 and a control unit 150. The sensor 130 may be disposed on a side surface 121s of the head plate 121 close to the probe card 110. The control unit 150 is coupled to the sensor 130 and configured to issue an alarm. As a result, the sensor 130 may be configured to measure the straight-line distance between the probe card 110 and the prober 120 in the horizontal direction (X axis or Y axis). FIG. 1 may be a schematic side view presented in the X-axis direction, and may also be a schematic side view presented in the Y-axis direction. In other words, the sensor 130 may be disposed on the X axis and/or the Y axis as shown in FIG. 1 to measure the straight-line distance between the probe card 110 and the prober 120 on the X axis and/or the Y axis. Here, the sensor 130 is separated from the edge of the head plate 121 by a shortest distance 130d ranging from 0.1 millimeter (mm) to 3 mm, for example (i.e., the sensor 130 is not in contact with the measured position). The sensor may be a current sensor, a capacitance sensor, or a laser sensor, but the disclosure is not limited thereto. In addition, a specific example of the control unit 150 will be described in the relevant paragraphs of FIG. 11.

With reference to FIG. 1 and FIG. 2, the probe card 110 and the head plate 121 of FIG. 1 are enlarged in FIG. 2. In some embodiments, the probe card 110 includes a reinforcement frame 111 and a printed circuit board 112. The specific position of the sensor 130 in the head plate 121 of the prober 120 may be as shown by a sensor 130a of FIG. 2. For example, the reinforcement frame 111 may be located between the sensor 130a and the printed circuit board 112, but the disclosure is not limited thereto.

With reference to FIG. 3, a probe card monitoring system 200 of FIG. 3 is similar to the probe card monitoring system 100 of FIG. 1, and the difference lies in: a sensor 230 of the probe card monitoring system 200 is disposed in the probe card 110, and the sensor 230 may be disposed on a side surface 110s of the probe card 110 close to the head plate 121. As a result, the sensor 230 may be configured to measure the straight-line distance between the probe card 110 and the prober 120 in the horizontal direction (X axis or Y axis). Here, the sensor 230 is separated from the edge of the reinforcement frame 111 by a shortest distance 230d ranging from 0.1 mm to 3 mm, for example (i.e., the sensor 230 is not in contact with the measured position).

With reference to FIG. 3 and FIG. 4, the probe card 110 and the head plate 121 of FIG. 3 are enlarged in FIG. 4. In some embodiments, the specific position of the sensor 230 in the probe card 110 may be as shown by a sensor 230a of FIG. 4. For example, the sensor 230a may be disposed in the reinforcement frame 111, but the disclosure is not limited thereto.

With reference to FIG. 1, FIG. 3, and FIG. 9, further, the structures of FIG. 1 and FIG. 3 in a top view may be the probe card monitoring system as shown in FIG. 9. In other words, on the X axis, a measure point T1 on the probe card monitoring system may be located in a peripheral region of the probe card 110 (e.g., the upper side and the lower side in FIG. 9), and the sensor may be located in one of the two positions pointed to by the measure point T1 (in the head plate 121 of the prober 120 or the reinforcement frame 111 of the probe card 110). Similarly, on the Y axis, a measure point T2 on the probe card monitoring system may be located in the peripheral region of the probe card 110 (e.g., the left side and the right side in FIG. 9), and the sensor may be located in one of the two positions pointed to by the measure point T2 (in the head plate 121 of the prober 120 or the reinforcement frame 111 of the probe card 110). Nonetheless, the disclosure is not limited thereto.

With reference to FIG. 5, a probe card monitoring system 300 of FIG. 5 is similar to the probe card monitoring system 100 of FIG. 1, and the difference lies in: a sensor 330 of the probe card monitoring system 300 is disposed in the clamping mechanism 122 of the prober 120, and the sensor 330 is disposed on a bottom surface 122s of the clamping mechanism 122 close to the probe card 110. As a result, the sensor 330 may be configured to measure the straight-line distance between the probe card 110 and the prober 120 in the vertical direction (Z axis). Here, the sensor 330 is separated from the edge of the clamping mechanism 122 by a shortest distance 330d ranging from 0.1 mm to 3 mm, for example (i.e., the sensor 330 is not in contact with the measured position).

With reference to FIG. 5, FIG. 6A, FIG. 6B, and FIG. 9, the probe card 110 and the clamping mechanism 122 of FIG. 5 are enlarged, FIG. 6A is presented in the perspective of viewing from the left to the right in FIG. 9, for example, and FIG. 6B is presented in the perspective of viewing from the bottom to the top in FIG. 9, for example. In some embodiments, the specific position of the sensor 330 in the clamping mechanism 122 of the prober 120 is shown by a sensor 330a of FIG. 6A or a sensor 330b of FIG. 6B. Since one of the sensor 330a and the sensor 330b may be selectively disposed, they are presented by broken lines.

In addition, with reference to FIG. 7, FIG. 8A, FIG. 8B, and FIG. 9, the probe card 110 and the clamping mechanism 122 of FIG. 7 are enlarged, FIG. 8A is presented in the perspective of viewing from the left to the right in FIG. 9, for example, and FIG. 8B is presented in the perspective of viewing from the bottom to the top in FIG. 9, for example. Moreover, FIG. 7. FIG. 8A, FIG. 8B are similar to FIG. 5, FIG. 6A, FIG. 6B, and the difference lies in: a sensor 430 of the probe card monitoring system of FIG. 7, FIG. 8A, and FIG. 8B is disposed on a top surface 110t of the probe card 110 close to the clamping mechanism 122. Here, the sensor 430 is separated from the edge of the probe card 110 by a shortest distance 430d ranging from 0.1 mm to 3 mm, for example (i.e., the sensor 430 is not in contact with the measured position).

Further, as shown in FIG. 6A, FIG. 6B, FIG. 8A, and FIG. 8B, the probe card 110 further includes a probe head 113 and at least one contact tab 114 (which may be physically connected to the clamping mechanism 122 as appropriate). The contact tab 114 is disposed on the reinforcement frame 111. The probe head 113 may include a base 113a and a probe 113b. The sensor may be disposed around the contact tab 114.

For example, as shown in FIG. 6A, FIG. 8A, and FIG. 9, there may be four contact tabs 114 in the probe card monitoring system, and there may be four measure points T3 on the reinforcement frame 111 beside the contact tabs 114. The sensor 330a may be located in the four positions pointed to by the measure points T3 (i.e., in the clamping mechanism 122 of the prober 120 or the reinforcement frame 111 of the probe card 110, while only two positions can be presented in the perspective of FIG. 6A). Alternatively, a central region of the probe card monitoring system (where the probe head 113 of the probe card 110 is located) may also have the measure point T3. The sensor 330b may be located in the position pointed to by the measure point T3 (i.e., in the clamping mechanism 122 of the prober 120 or the printed circuit board 112 of the probe card 110). Nonetheless, the disclosure is not limited thereto.

In some embodiments, the measure point T3 on the probe card monitoring system is separated from the contact tab 114 by a spacing ranging from 0.1 mm to 3 mm (i.e., the sensor is not in contact with the measured position). In the spacing design above, the contact tab 114 may be adjacent to the probe head 113. As a result, it is possible to exclude the influence of other factors (e.g., displacement in the vertical direction caused by the external force on the edge), and improve the accuracy of monitoring. Nonetheless, the disclosure is not limited thereto. Here, the measure points T1, T2, and T3 on the probe card monitoring system may not be on the contact tab 114, but the disclosure is not limited thereto.

Figure 10A:
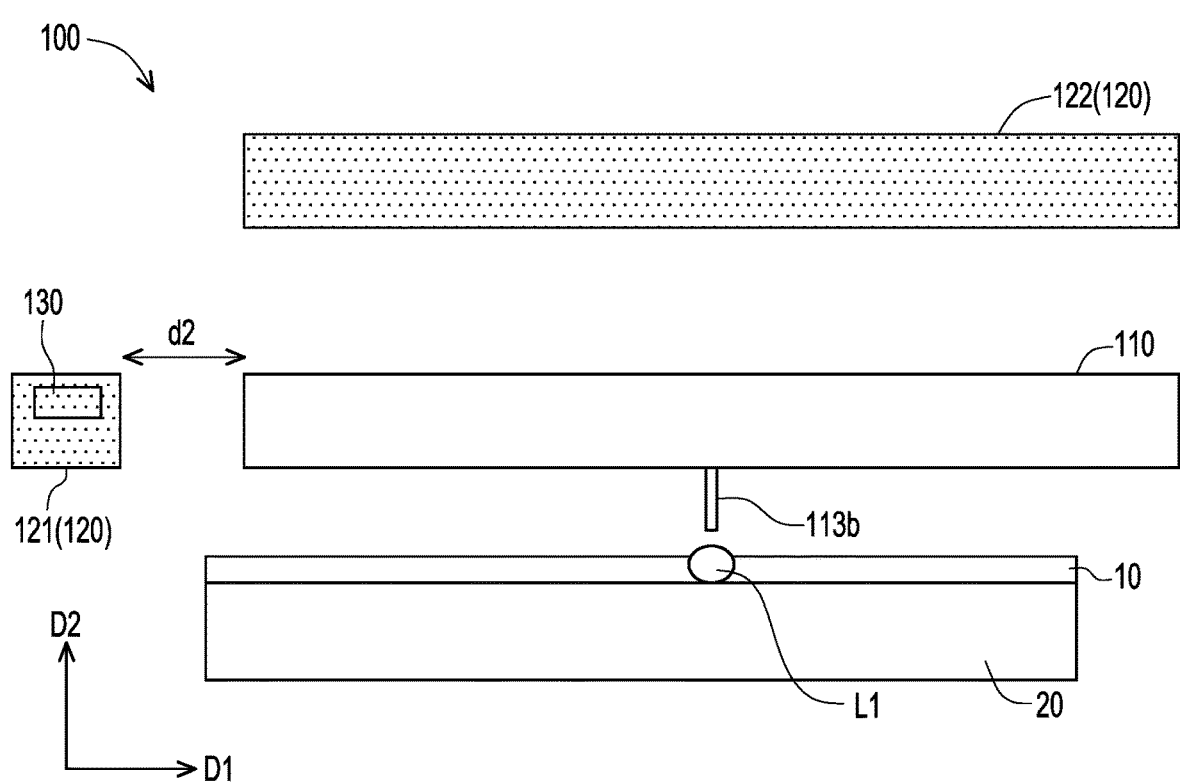
FIG. 10A is a schematic side view of the probe card monitoring system of FIG. 1 being offset during monitoring.
Figure 10B:
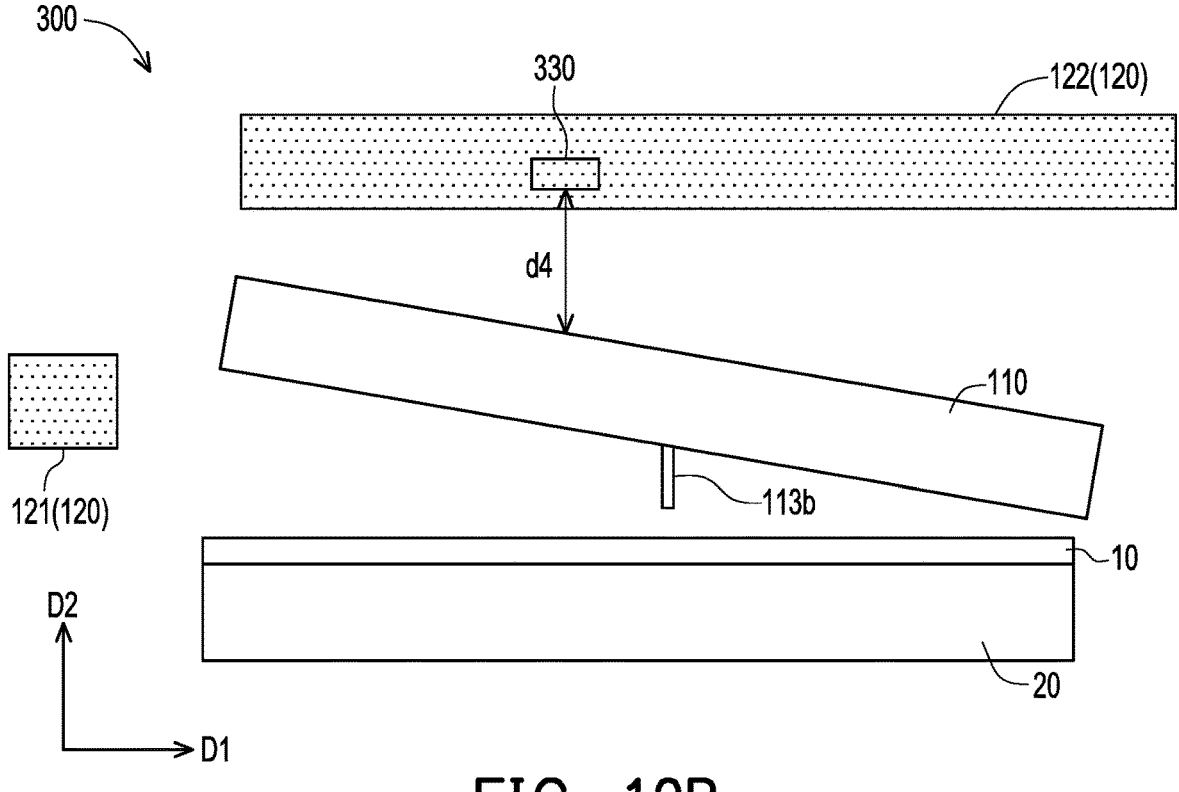
FIG. 10B is a schematic side view of the probe card monitoring system of FIG. 5 being offset during monitoring.
Figure 11:
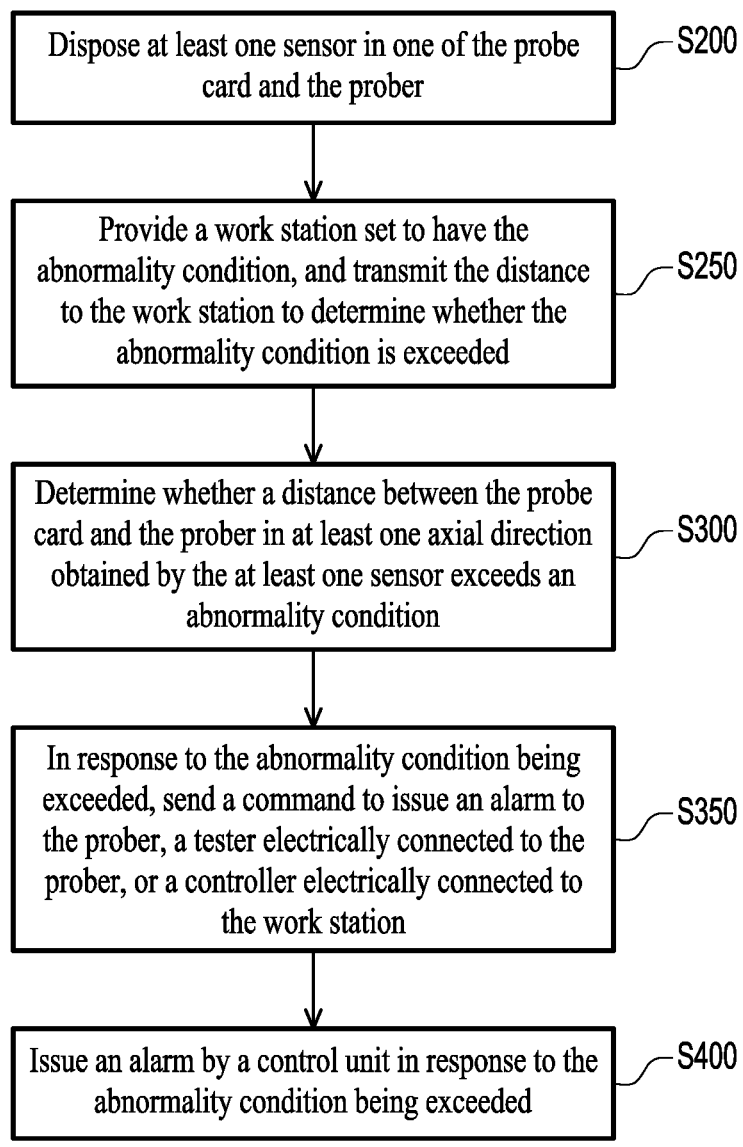
FIG. 11 is a schematic flowchart of a probe card monitoring method according to some embodiments of the disclosure.

FIG. 10A is a schematic side view of the probe card monitoring system of FIG. 1 being offset during monitoring. FIG. 10B is a schematic side view of the probe card monitoring system of FIG. 5 being offset during monitoring. FIG. 11 is a schematic flowchart of a probe card monitoring method according to some embodiments of the disclosure.

With reference to FIG. 1, FIG. 10A, and FIG. 11, FIG. 1, FIG. 10A, and FIG. 11 will serve to illustrate the following example of offset in the first axial direction D1 and the corresponding monitoring method thereof. First, as shown in FIG. 1, when the probe 113b of the probe card 110 is in contact with a wafer 10 at a correct position L1, a straight-line distance between the side surface 121s of the head plate 121 and the probe card 110 is d1. Comparatively, as shown in FIG. 10A, when the probe card 110 is offset in a direction away from the head plate 121 (e.g., rightward in FIG. 1 and FIG. 10A), the probe 113b of the probe card 110 is in contact with the wafer 10 at an offset position L2, and there is a straight-line distance d2 greater than the distance d1 between the head plate 121 and the probe card 110. In this way, abnormality (e.g., deformation or displacement) of the probe card 110 during the testing process may be reflected in real time by monitoring the value of the distance, reducing the probability of damage to the probe card 110 and the wafer 10 and improving the accuracy of measurement. Here, the wafer 10 may be disposed on a chuck 20, but the disclosure is not limited thereto.

For example, a monitoring method adapted for any one of a probe card or a prober is performed in the following steps, and the prober may clamp the probe card. First, at least one sensor is disposed in one of the probe card and the prober (step S200). Next, it is determined whether a distance between the probe card and the probe in at least one axial direction obtained by at least one sensor exceeds an abnormality condition (step S300). Then, an alarm is issued by a control unit in response to the abnormality condition being exceeded (step S400).

In some embodiments, the monitoring method may include the following between step S200 and step S300. A work station set to have the abnormality condition is provided, and the distance is transmitted to the work station to determine whether the abnormality condition is exceeded (step S250). In other words, the work station may set monitoring range specifications, store distance data measured by the sensor and fed back to the work station, and determine whether the formulated specification is exceeded, but the disclosure is not limited thereto. Here, the specification settings may be determined depending on the actual design requirements, and are not limited by the disclosure.

In some embodiments, the monitoring method may include the following between step S300 and step S400. In response to the abnormality condition being exceeded, an command to issue an alarm is sent to the prober, a tester electrically connected to the prober, or a controller (not shown) electrically connected to the work station (step S350). The control unit is the prober, the tester, or the controller, but the disclosure is not limited thereto. Here, the controller is a host, a computer, or the like, for example.

In some embodiments, when the control unit is a prober or a tester, the sensor is coupled to the prober or the tester through a network (such as Ethernet, RS232, RS485 and other communication protocols). Comparatively, when the control unit is a controller, the sensor and the controller are coupled through a cable. Nonetheless, the disclosure is not limited thereto.

In some embodiments, the monitoring method may be performed during any process, such as wafer testing, probe clearing, or the like, and may be applied to any suitable interface, but the disclosure is not limited thereto.

In some embodiments, the probe card monitoring system and the monitoring method thereof may further help in adjustment to obtain relatively stable testing parameters and improve testing quality, but the disclosure is not limited thereto.

With reference to FIG. 5, FIG. 10B, and FIG. 11, FIG. 5, FIG. 10B, and FIG. 11 will serve to illustrate the following example of offset in the second axial direction D2 and the corresponding monitoring method thereof. First, as shown in FIG. 5, when the probe card 110 and the wafer 10 are at a correct position, a straight-line distance between the clamping mechanism 122 and the probe card 110 is d3. Comparatively, as shown in FIG. 10B, when the probe card 110 is offset in the second axial direction D2 (e.g., in the up-down direction in FIG. 5 and FIG. 10B), the probe card 110 and the wafer 10 are located at an offset position, and there is a straight-line distance d4 greater than the distance d3 between the clamping mechanism 122 and the probe card 110. In this way, abnormality (e.g., deformation or displacement) of the probe card 110 during the testing process may be reflected in real time by monitoring the value of the distance, reducing the probability of damage to the probe card 110 and the wafer 10 and improving the accuracy of measurement.

It should be noted that the above examples of offset and the corresponding monitoring methods thereof may correspond to all of the embodiments described herein and may be adjusted depending on the actual design requirements, which are not limited by the disclosure, and all fall within the scope of protection of the disclosure as long as the sensor is disposed in one of the probe card and the prober to measure the distance between the probe card and the prober in at least one axial direction.

In summary of the foregoing, in the embodiments of the disclosure, the sensor configured to measure the relative distance between the probe card and the prober in at least one axial direction is introduced into the probe card monitoring system. In this way, the status of the probe card during the testing process may be reflected in real time by monitoring the value of the distance, reducing the probability of damage to the probe card and the wafer and improving the accuracy of measurement.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A probe card monitoring system adapted for any one of a probe card comprising a reinforcement frame, at least one contact tab disposed on the reinforcement frame, and a printed circuit board or a prober comprising a head plate and a clamping mechanism, wherein the probe card monitoring system comprises:

at least one sensor disposed in one of the probe card and the prober to measure a distance between the probe card and the prober in at least one axial direction; and a control unit coupled to the at least one sensor and configured to issue an alarm; wherein a measure point on the probe card monitoring system is not on the at least one contact tab, the at least one contact tab is physically connected to the clamping mechanism, and the measure point on the probe card monitoring system is separated from the at least one contact tab by a spacing ranging from 0.1 millimeter (mm) to 3 mm.

2. The probe card monitoring system according to claim 1, wherein the at least one axial direction is one, two, or three of an X axis, a Y axis, and a Z axis.

3. The probe card monitoring system according to claim 1, wherein the at least one axial direction is an X axis and/or a Y axis, and the at least one sensor is disposed in the head plate of the prober.

4. The probe card monitoring system according to claim 3, wherein the at least one sensor is disposed on a side surface of the head plate close to the probe card.

5. The probe card monitoring system according to claim 3, wherein the reinforcement frame is located between the at least one sensor and the printed circuit board.

6. The probe card monitoring system according to claim 1, wherein the at least one axial direction is an X axis and/or a Y axis, and the at least one sensor is disposed in the probe card.

7. The probe card monitoring system according to claim 6, wherein the at least one sensor is disposed on a side surface of the probe card close to the head plate.

8. The probe card monitoring system according to claim 6, wherein the at least one sensor is disposed in the reinforcement frame.

9. The probe card monitoring system according to claim 1, wherein the at least one axial direction is a Z axis, and the at least one sensor is disposed in the clamping mechanism.

10. The probe card monitoring system according to claim 9, wherein the at least one sensor is disposed on a bottom surface of the clamping mechanism close to the probe card.

11. The probe card monitoring system according to claim 1, wherein the at least one axial direction is a Z axis, and the at least one sensor is disposed in the probe card.

12. The probe card monitoring system according to claim 11, wherein the at least one sensor is disposed on a top surface of the probe card close to the clamping mechanism.

13. The probe card monitoring system according to claim 1, wherein the at least one axial direction is an X axis and/or a Y axis, and a measure point on the probe card monitoring system is located in a peripheral region of the probe card.

14. The probe card monitoring system according to claim 1, wherein the at least one axial direction is a Z axis, and a measure point on the probe card monitoring system is located in a central region of the probe card.

15. The probe card monitoring system according to claim 14, wherein the probe card further comprises a probe head, and the central region is a region where the probe head is disposed.

16. A probe card monitoring method adapted for any one of a probe card comprising a reinforcement frame, at least one contact tab disposed on the reinforcement frame, and a printed circuit board or a prober comprising a head plate and a clamping mechanism, wherein the probe card monitoring method comprises:

disposing at least one sensor in one of the probe card and the prober;

determining whether a distance between the probe card and the prober in at least one axial direction obtained by the at least one sensor exceeds an abnormality condition; and issuing an alarm by a control unit in response to the abnormality condition being exceeded, wherein

10 a measure point on the probe card monitoring system is not on the at least one contact tab, the at least one contact tab is physically connected to the clamping mechanism, and the measure point on the probe card monitoring system is separated from the at least one contact tab by a spacing ranging from 0.1 millimeter (mm) to 3 mm.

17. The probe card monitoring method according to claim 16, further comprising:

providing a work station, wherein the work station is set to have the abnormality condition; and transmitting the distance to the work station to determine whether the abnormality condition is exceeded.

18. The probe card monitoring method according to claim 16, wherein the control unit is the prober, a tester electrically connected to the prober, or a controller electrically connected to a work station.

* * * * *